United States Patent
Chang et al.

(10) Patent No.: US 10,755,943 B2
(45) Date of Patent: Aug. 25, 2020

(54) METHOD FOR MANUFACTURING SEMICONDUCTOR DEVICE

(71) Applicant: TAIWAN SEMICONDUCTOR MANUFACTURING CO., LTD., Hsinchu (TW)

(72) Inventors: Jung-Hao Chang, Taichung (TW); Chao-Hsien Huang, Tainan (TW); Wen-Ting Lan, Hsinchu (TW); Shi-Ning Ju, Hsinchu (TW); Li-Te Lin, Hsinchu (TW); Kuo-Cheng Ching, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/221,766

(22) Filed: Dec. 17, 2018

(65) Prior Publication Data

US 2019/0139777 A1    May 9, 2019

Related U.S. Application Data

(63) Continuation of application No. 15/794,262, filed on Oct. 26, 2017, now Pat. No. 10,157,751.

(51) Int. Cl.
*H01L 21/308* (2006.01)
*H01L 29/66* (2006.01)
*H01L 21/311* (2006.01)
*H01L 21/033* (2006.01)
*H01L 21/8234* (2006.01)

(52) U.S. Cl.
CPC ...... *H01L 21/3086* (2013.01); *H01L 21/0337* (2013.01); *H01L 21/31144* (2013.01); *H01L 21/823431* (2013.01); *H01L 29/66795* (2013.01)

(58) Field of Classification Search
CPC .................. H01L 21/3088; H01L 29/66795
See application file for complete search history.

(56) References Cited

U.S. PATENT DOCUMENTS 9,214,548 B1 * 12/2015 Kim ................... H01L 27/088
9,911,619 B1 *  3/2018 Xie .................. H01L 29/66795

* cited by examiner

*Primary Examiner* — Farun Lu
(74) *Attorney, Agent, or Firm* — McClure, Qualey & Rodack, LLP

(57) ABSTRACT

A method includes forming a mandrel structure over a semiconductor substrate. A first spacer and a second spacer are formed alongside the mandrel structure. A mask layer is over a first portion of the first spacer, in which a second portion of the first spacer and the second spacer are exposed from the mask layer. The exposed second spacer is etched, in which etching the exposed second spacer is performed such that a polymer is formed over a top surface of the exposed second portion of the first spacer. The mask layer, the polymer, and the mandrel structure are removed. The semiconductor substrate is patterned using the first spacer.

20 Claims, 10 Drawing Sheets

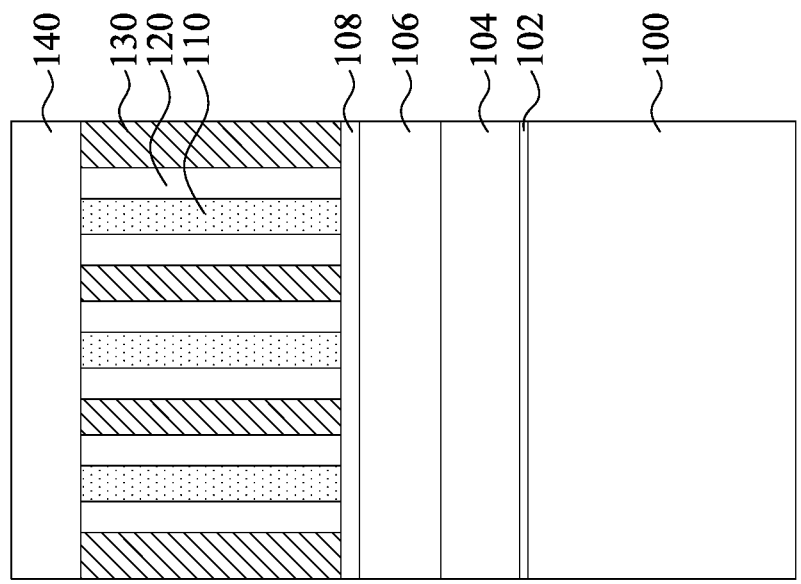
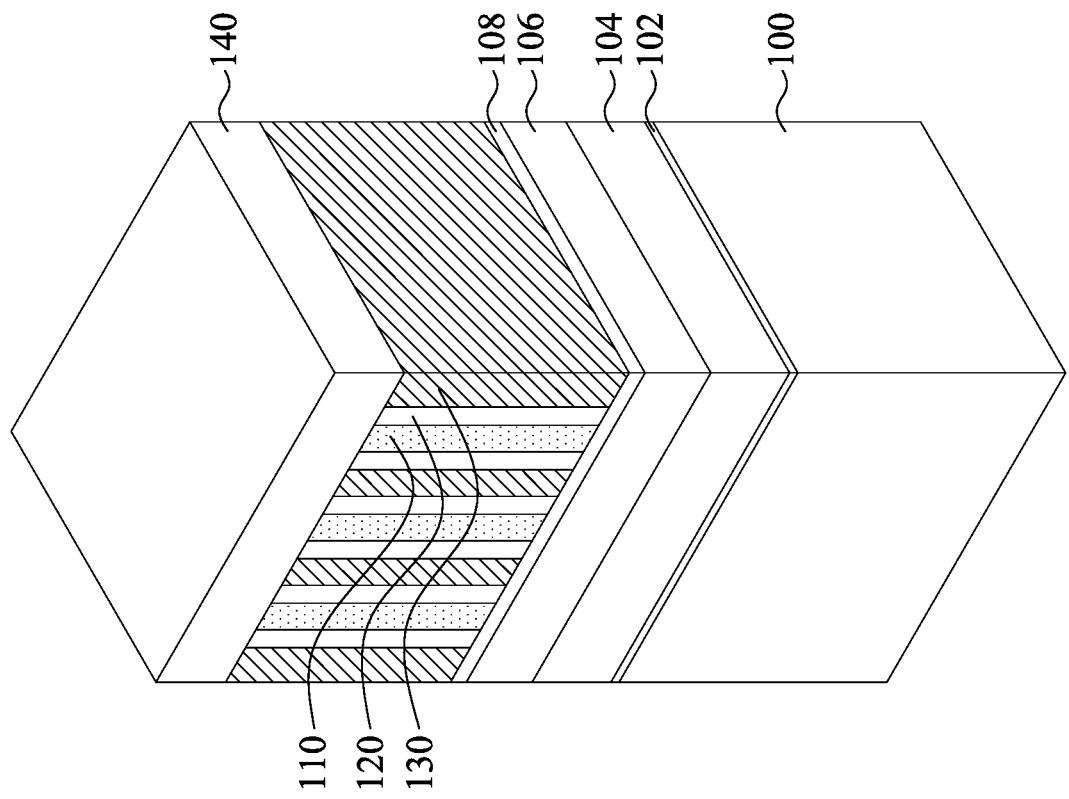
Fig. 5B
Fig. 5A

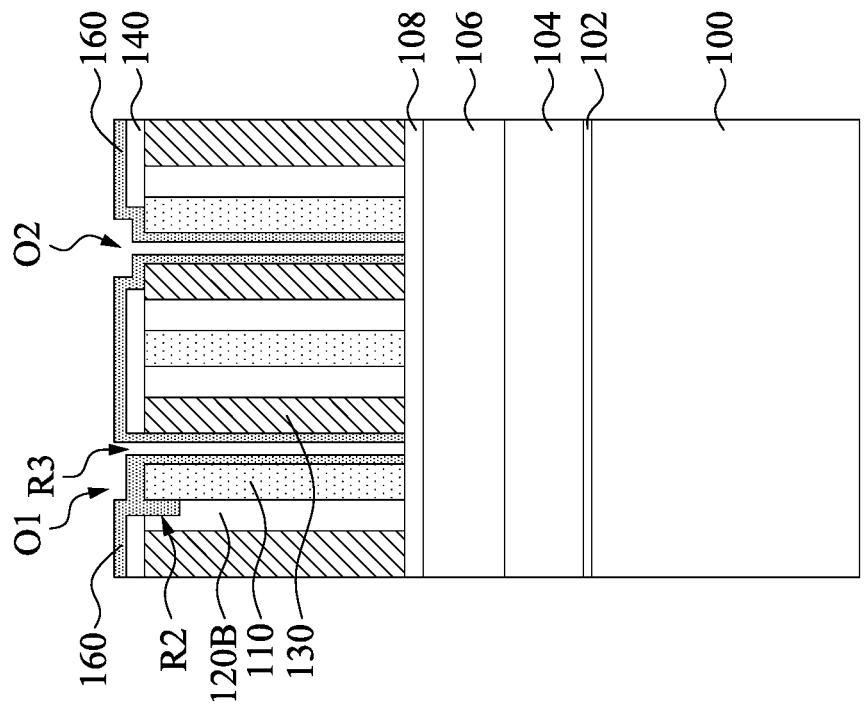
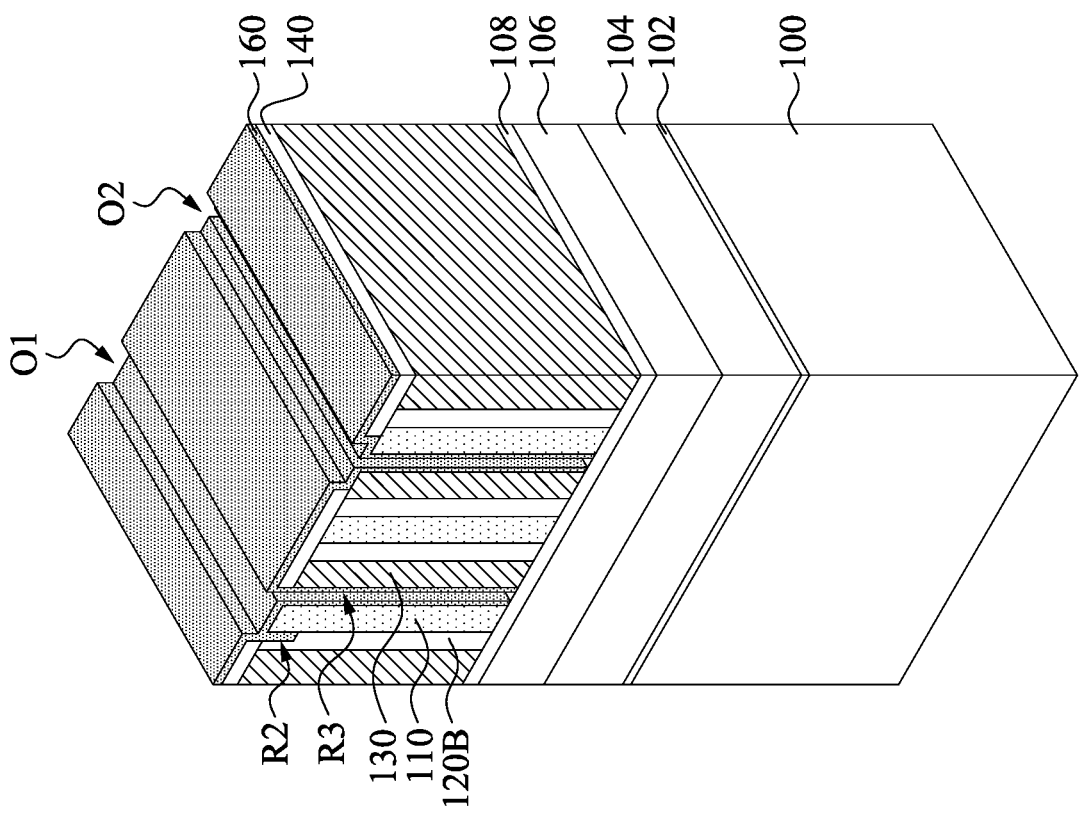

METHOD FOR MANUFACTURING SEMICONDUCTOR DEVICE

PRIORITY CLAIM AND CROSS-REFERENCE

The present application is a continuation application of U.S. application Ser. No. 15/794,262, filed Oct. 26, 2017, now U.S. Pat. No. 10,157,751, issued on Dec. 18, 2018, which is herein incorporated by reference in its entirety.

BACKGROUND

The semiconductor integrated circuit (IC) industry has experienced rapid growth. In the course of IC evolution, functional density (i.e., the number of interconnected devices per chip area) has increased while geometry size (i.e., the smallest component (or line) that can be created using a fabrication process) has decreased. This scaling down process increases production efficiency and lowers associated costs.

Such scaling down has also increased the complexity of processing and manufacturing ICs and, for these advances to be realized, similar developments in IC processing and manufacturing are desired. For example, a three dimensional transistor, such as a fin-like field-effect transistor (FinFET), has been introduced to replace a planar transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A to 10B illustrate a method of manufacturing a semiconductor device at various stages in accordance with some embodiments.

DETAILED DESCRIPTION

Figure 1B:
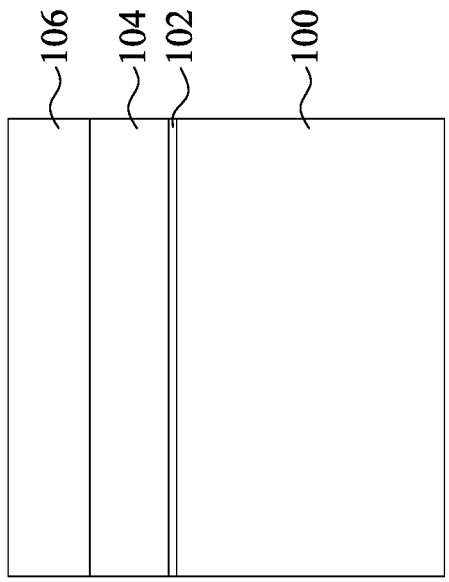

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A to 10B illustrate a method of manufacturing a semiconductor device at various stages in accordance with some embodiments.

Figure 1A:
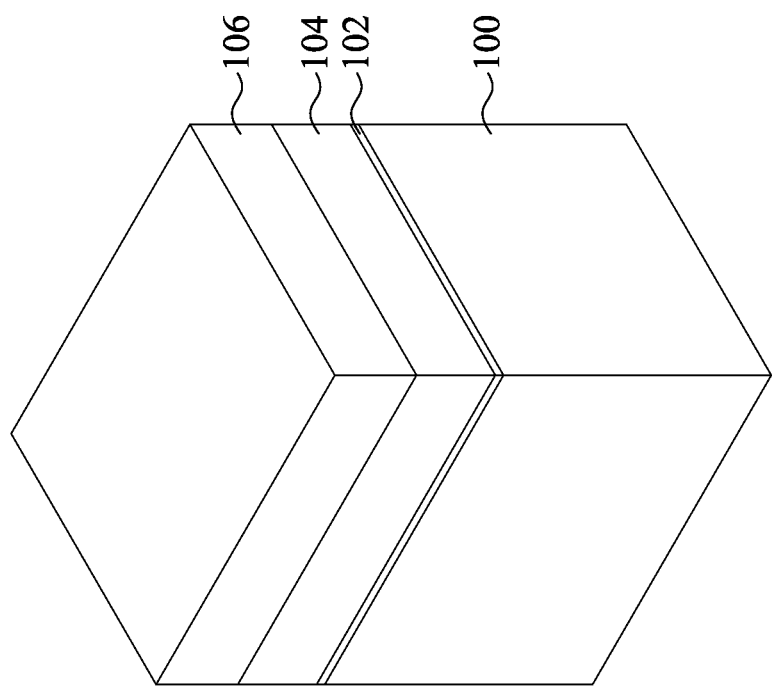

Reference is made to FIGS. 1A and 1B, in which FIG. 1A is a perspective view of one stage of manufacturing a semiconductor device, and FIG. 1B is a cross-sectional view taking along line B-B of FIG. 1A. A semiconductor substrate 100 is provided. The semiconductor substrate 100 may be a bulk silicon substrate. Alternatively, the semiconductor substrate 100 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 100 also include a silicon-on-insulator (SOI) substrate. SOI substrates are fabricated using separation by implantation of oxygen (SIMOX), wafer bonding, and/or other suitable methods.

The semiconductor substrate 100 may also include various doped regions. The doped regions may be doped with p-type dopants, such as boron or $BF_2$; n-type dopants, such as phosphorus or arsenic; or combinations thereof. The doped regions may be formed directly on the semiconductor substrate 100, in a P-well structure, in an N-well structure, in a dual-well structure, and/or using a raised structure. The semiconductor substrate 100 may further include various active regions, such as regions configured for an N-type metal-oxide-semiconductor transistor device and regions configured for a P-type metal-oxide-semiconductor transistor device.

A pad layer 102 is formed over the semiconductor substrate 100. The pad layer 102 is an insulator layer including a dielectric material such as silicon oxide, silicon nitride, silicon oxynitride, or a combination thereof. In some embodiments, the pad layer 102 may also be referred to as a pad layer 102. The pad layer 102 may be formed by one or more deposition techniques, such as chemical vapor deposition (CVD), physical vapor deposition (PVD), plasma-enhanced CVD (PECVD), and atomic layer deposition (ALD), or other suitable process(es). In some other embodiments, the pad layer 102 includes oxide, and may be formed by, for example, thermal oxidation. In some embodiments, pad layer 102 may be a pad oxide layer. In some other embodiment, the pad layer 102 is provided to improve the interface of the semiconductor substrate 100 and an overlying layer (e.g., the hard mask layer 104), for example, reducing the stress between layers and thus, potential deformation of layer(s).

A hard mask layer 104 is formed over the semiconductor substrate 100 and covers the pad layer 102. In some embodiments, the hard mask layer 104 is formed from silicon nitride, for example, using Low-Pressure Chemical Vapor Deposition (LPCVD). In some other embodiments, the hard mask layer 104 is formed by thermal nitridation of silicon, Plasma Enhanced Chemical Vapor Deposition (PECVD), or plasma anodic nitridation. The hard mask layer 104 is used as a hard mask during the following processes, such as photolithography processes. In some embodiments, the thickness of the hard mask layer 104 may be less than about 500 Å. In some other embodiments, the thickness of the hard mask layer 104 may be between about 100 Å and about 400 Å. In some embodiments, the pad layer 102 may also act as an etch stop layer for etching hard mask layer 104 in the following processes, such as photolithography processes.

Another hard mask layer 106 is formed over the semiconductor substrate 100 and covering the pad layer 102 and the hard mask layer 104. In some embodiments, the hard mask layer 106 may be formed from a dielectric material such as silicon oxide, silicon oxynitride, or a combination thereof. The hard mask layer 106 may be formed by one or more deposition techniques, such as chemical vapor deposition (CVD), physical vapor deposition (PVD), plasma-enhanced CVD (PECVD), and atomic layer deposition (ALD), or other suitable process(es). In some other embodiments, the hard mask layer 106 includes oxide, and may be formed by, for example, thermal oxidation. In some other embodiments, the hard mask layer 104 and the hard mask layer 106 are made from different materials to provide selectivity during the following processes, such as etching. For example, in FIGS. 1A and 1B, the hard mask layer 106 includes oxide, the hard mask layer 104 includes nitride, and the pad layer 102 includes oxide, and the present disclosure is not limited in this respect.

Figure 2B:
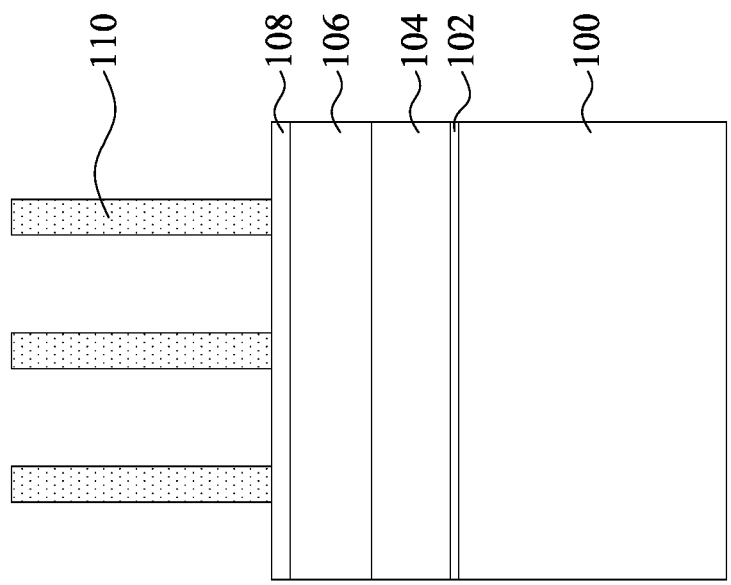
Figure 2A:
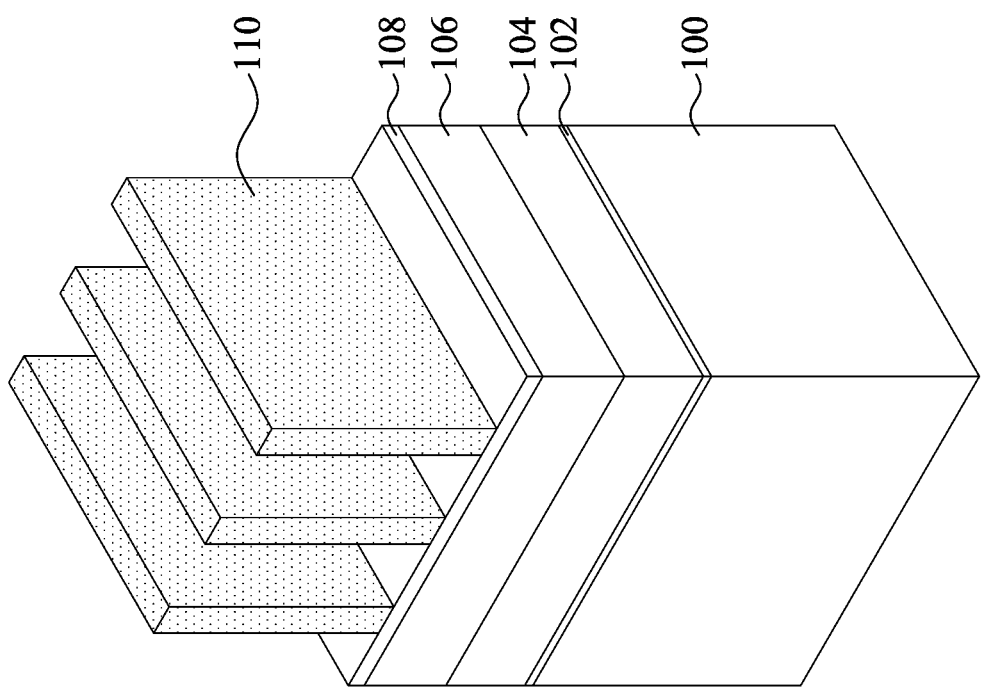

Reference is made to FIGS. 2A and 2B, in which FIG. 2A is a perspective view of one stage of manufacturing a semiconductor device, and FIG. 2B is a cross-sectional view taking along line B-B of FIG. 2A. An etching stop layer 108 may by optionally formed over the semiconductor substrate 100 and covers the hard mask layer 106. In some embodiments, the etching stop layer 108 may include silicon nitride (SiN), oxynitride, silicion carbon (SiC), silicon oxynitride (SiON), oxide, or the like. The etching stop layer 108 may be formed by methods such as CVD, plasma enhanced CVD, sputter, or the like.

A plurality of dummy structures 110 is formed over the semiconductor substrate 100. In some embodiments, the dummy structures 110 may be formed by blanket a material layer over the semiconductor substrate 100 and following with a patterning process, such as photolithography, to form a desired pattern of the dummy structures 110. The dummy structures 110 can also be referred to as mandrel structures 110.

In some embodiments, the dummy structures 110 are formed by semiconductor material having a single crystalline or polycrystalline structure. For example, the dummy structures 110 may include single-crystalline silicon, polycrystalline silicon, and/or other suitable materials. In some other embodiments, the dummy structures 110 may include amorphous silicon (a-Si).

Figure 3B:
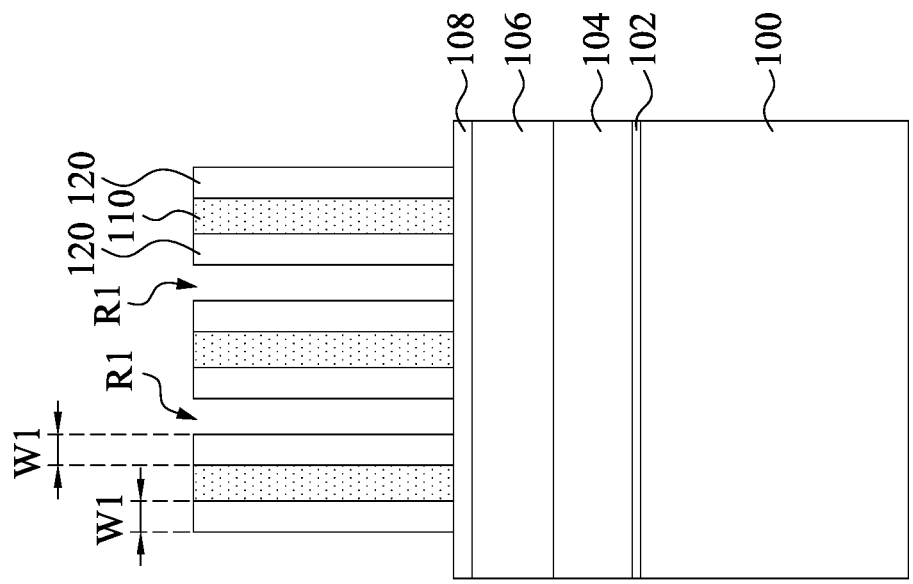
Figure 3A:
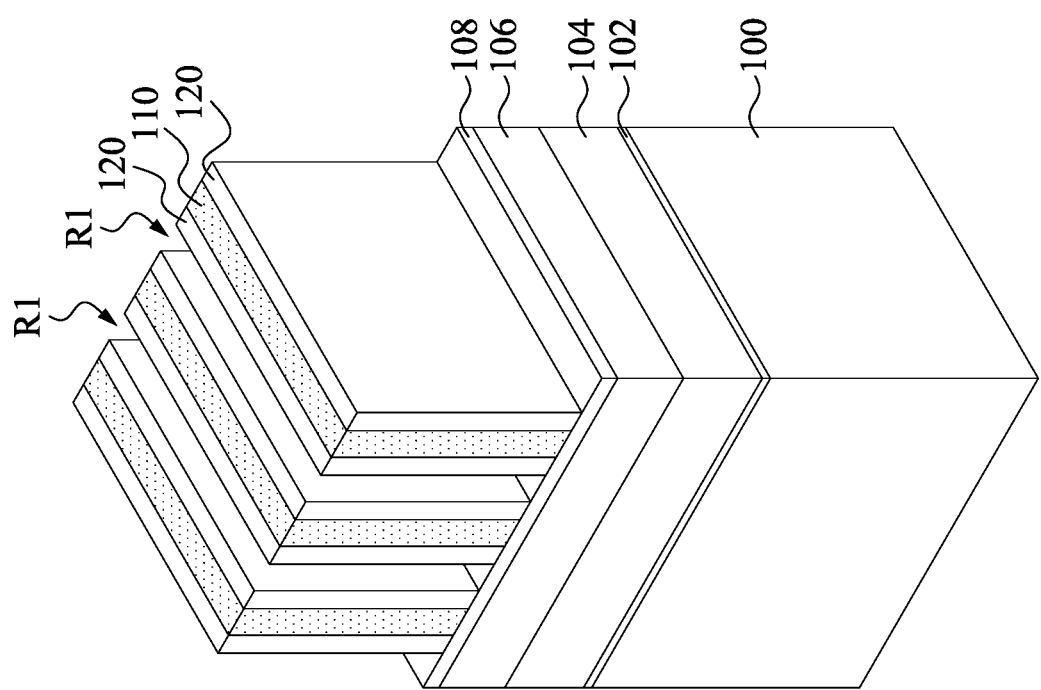

Reference is made to FIGS. 3A and 3B, in which FIG. 3A is a perspective view of one stage of manufacturing a semiconductor device, and FIG. 3B is a cross-sectional view taking along line B-B of FIG. 3A. A plurality of sidewall spacers 120 are formed on opposite sidewalls of the dummy structures 110, respectively. In some embodiments, the sidewall spacers 120 can be formed by blanket depositing one or more dielectric layer(s) (not shown) on the previously formed structure (e.g. the dummy structures 110 in this case). The dielectric layer(s) may include silicon nitride (SiN), oxynitride, silicion carbon (SiC), silicon oxynitride (SiON), or the like. The sidewall spacers 120 may be formed by methods such as CVD, plasma enhanced CVD, sputter, or the like. The sidewall spacers 120 may then be patterned, such as by one or more etch processes to remove horizontal portions of the sidewall spacers 120 from the horizontal surfaces of the structure. In some embodiments, the etching process may include suitable anisotropic etching processes such as, for example, plasma etching, reactive ion etching (RIE), ion beam etching, and/or suitable etching techniques.

In some embodiments, the sidewall spacers 120 are self-aligned to the dummy structures 110 as the deposition occurs in a substantially conformal manner on exposed surfaces of the dummy structures 110 surfaces. Thus, the formed sidewall spacers 120 may be of substantially uniform width W1, respectively. The width W1 may be ranged from micrometer to nanometer depending on processes. In some embodiments, the width W1 ranges from 5 nm to 20 nm. The sidewall spacers 120 may act as a hard mask during the following processes, such as photolithography. Accordingly, in the following descriptions, the sidewall spacers 120 are referred to hard mask strips 120. After the sidewall spacers 120 are formed, a plurality of recesses R1 are formed between two adjacent sidewall spacers 120.

Figure 4B:
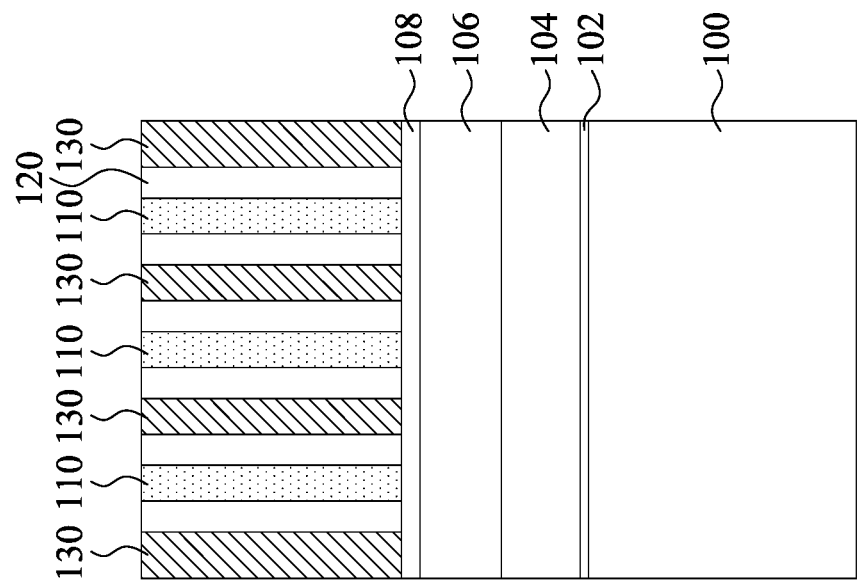
Figure 4A:
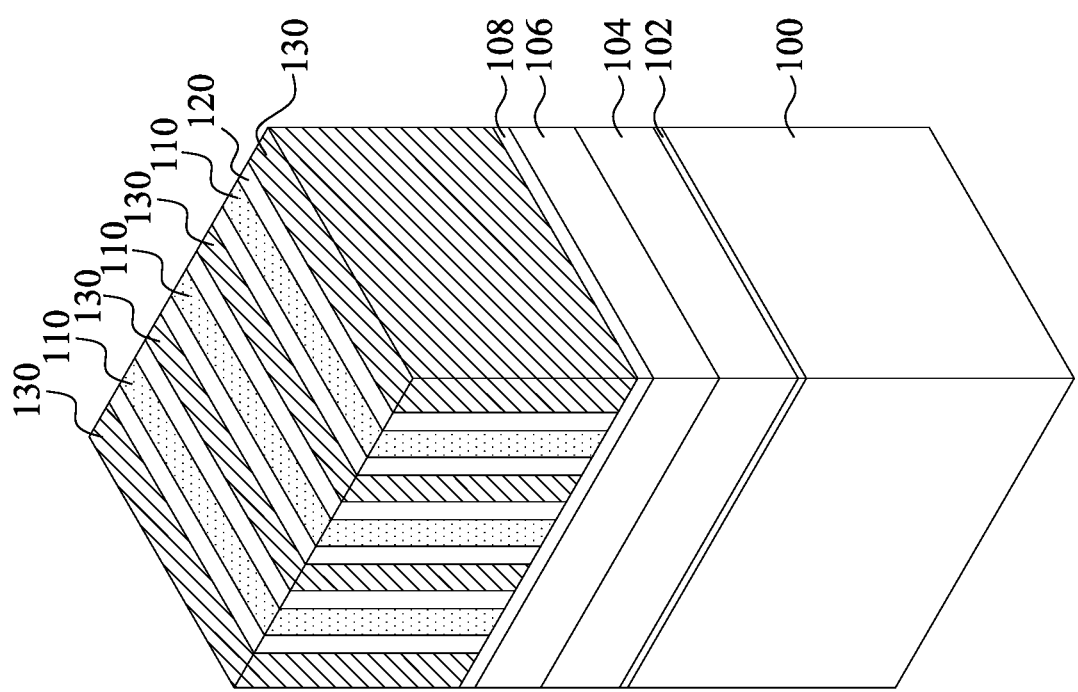

Reference is made to FIGS. 4A and 4B, in which FIG. 4A is a perspective view of one stage of manufacturing a semiconductor device, and FIG. 4B is a cross-sectional view taking along line B-B of FIG. 4A. A plurality of dummy structures 130 are formed over the semiconductor substrate 100 and fill the recesses R1 (referring to FIGS. 3A and 3B). In other words, the spaces between two adjacent sidewall spacers 120 are filled with the dummy structures 130. In some embodiments, the dummy structure 130 may be formed by, for example, blanket a material layer over the semiconductor substrate 100 and following with a planarization process, such as chemical mechanism polishing (CMP) process, to remove the excessive material layer until the dummy structures 110 are exposed. As a result, top surfaces of the dummy structures 110, the hard mask strips 120, and the dummy structures 130 are substantially coplanar. The dummy structures 130 can also be referred to as mandrel structures 130.

In some embodiments, the dummy structures 130 are formed by semiconductor material having a single crystalline or polycrystalline structure. For example, the dummy structures 130 may include single-crystalline silicon, polycrystalline silicon, and/or other suitable materials. In some other embodiments, the dummy structures 130 may include amorphous silicon (a-Si). The dummy structures 110 and the dummy structures 130 may be formed from the same material in some embodiments, and may be formed from different materials in some other embodiments.

Reference is made to FIGS. 5A and 5B, in which FIG. 5A is a perspective view of one stage of manufacturing a semiconductor device, and FIG. 5B is a cross-sectional view taking along line B-B of FIG. 5A. A hard mask layer 140 is formed over the semiconductor substrate 100. The hard mask layer 140 covers and is in contact with the dummy structures 110, the hard mask strips 120, and the dummy structures 130.

In some embodiments, the hard mask layer 140 may be formed from a dielectric material such as silicon (Si), silicon carbide (SiC), tungsten carbide (WC), boron-doped silicon (e.g., SiB), silicon nitride (SiN), silicon oxide (SR)), silicon germanium (SiGe), or a combination thereof. In some other embodiments, the hard mask layer 140 may be formed from a metal oxide material such as AlO, ZrO, HfO, or other suitable materials. The hard mask layer 140 may be formed by one or more deposition techniques, such as chemical vapor deposition (CVD), physical vapor deposition (PVD), plasma-enhanced CVD (PECVD), and atomic layer deposition (ALD), or other suitable process(es). In some other embodiments, the hard mask layer 140 includes oxide, and may be formed by, for example, thermal oxidation. The hard mask layer 140 and the hard mask layer 106 may be made from the same material in some embodiments, and the etching stop layer 108 may protect the hard mask layer 106 in the following processes, such as etching the dummy structures 110 and/or 130.

Figure 6B:
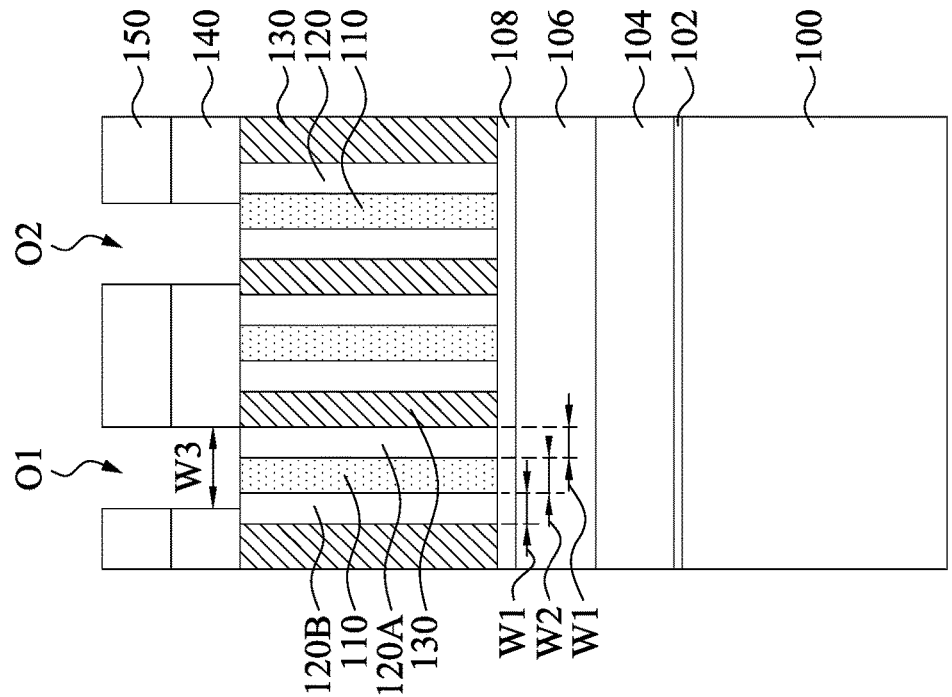
Figure 6A:
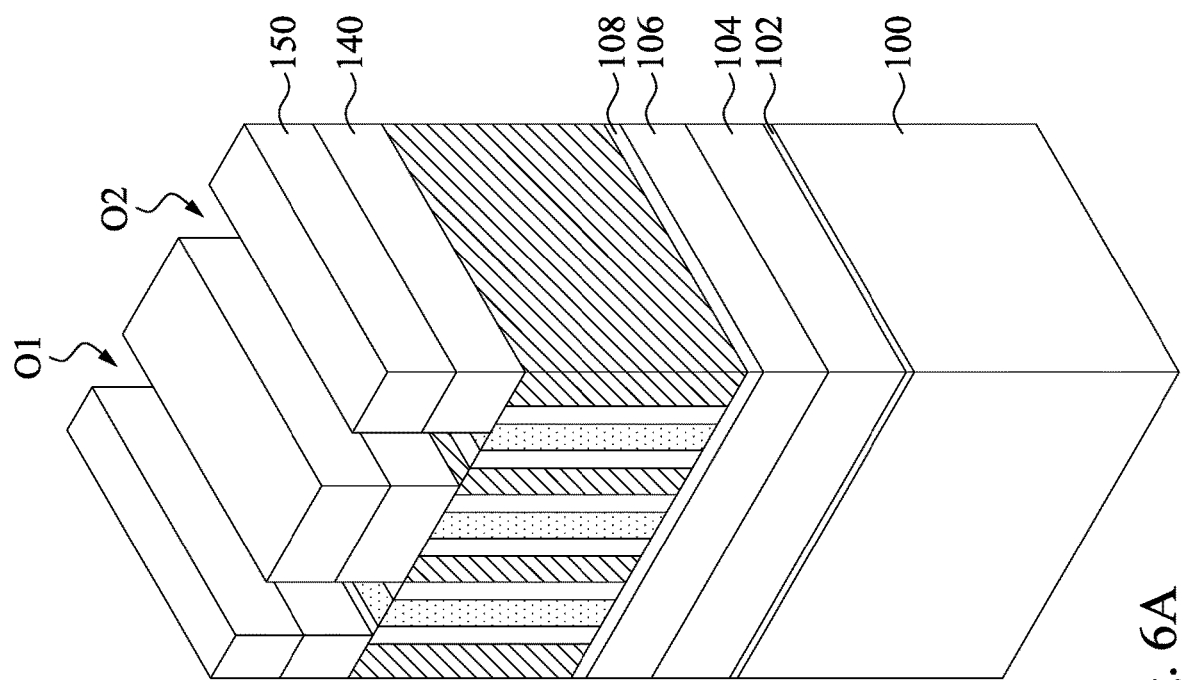

Reference is made to FIGS. 6A and 6B, in which FIG. 6A is a perspective view of one stage of manufacturing a semiconductor device, and FIG. 6B is a cross-sectional view taking along line B-B of FIG. 6A. A patterned mask 150 is formed over the semiconductor substrate 100. The patterned mask 150 may be formed by, for example, forming a mask layer over the hard mask layer 140, and patterning the mask layer. Then, the hard mask layer 140 is patterned using the patterned mask 150 as a mask. As a result, an opening O1 and an opening O2 are formed in the patterned hard mask layer 140.

In some embodiments, the patterned mask 150 may be formed from a dielectric material such as silicon (Si), silicon carbide (SiC), tungsten carbide (WC), boron-doped silicon (e.g., SiB), silicon nitride (SiN), silicon oxide (SiO), silicon germanium (SiGe), or a combination thereof. In some other embodiments, the patterned mask 150 may be formed from a metal oxide material such as AlO, ZrO, HfO, or other suitable materials. The patterned mask 150 may be formed by one or more deposition techniques, such as chemical vapor deposition (CVD), physical vapor deposition (PVD), plasma-enhanced CVD (PECVD), and atomic layer deposition (ALD), or other suitable process(es). In some other embodiments, the patterned mask 150 includes oxide, and may be formed by, for example, thermal oxidation. The patterned mask 150 and the hard mask layer 140 may be made from different materials to provide etching selectivity. In some other embodiments, the patterned mask 150 can be a photoresist. The photoresist may include polymer or other suitable materials, and the photoresist may be formed using a coating process, and the present disclosure is not limited in this respect.

In some embodiments, the opening O1 exposes one of the dummy structures 110 and at least two of the hard mask strips 120 adjacent to the one of the dummy structures 110. Or, in some other embodiments, the opening O1 exposes one of the dummy structures 130 and at least two of the hard mask strips 120 adjacent to the one of the dummy structures 130. On the other hand, the opening O2 exposed one of the hard mask strips 120, one of the dummy structures 110, and one of the dummy structures 130, in which the exposed dummy structure 110 and the exposed dummy structure 130 are adjacent to opposite sidewalls of the exposed hard mask strips 120, respectively. The hard mask strips 120 have the width W1, the dummy structures 110 have a width W2, and the opening O1 has a width W3, in which the widths W1, W2, and W3 satisfy the following equation: (W1+W2) <W3<(2*W1+W2). In other words, the width W3 of the opening O1 is greater than the sum of the width W1 of the hard mask strips 120 and the width W2 of the dummy structures 110, and is smaller than the sum of twice of the width of the hard mask strips 120 and the width W2 of the dummy structures 110.

In some embodiments, the width W3 of the opening O1 is referred to as a critical dimension (CD). That is, the width W3 may be the smallest width in the current node generation. Thus, in some embodiments, some openings (e.g. the opening O2) may expose one of the hard mask strips 120 desired to be removed. However, in some other embodiments, (e.g. the opening O2) may expose two of the hard mask strips 120 due to alignment error, in that one of the hard mask strips 120 is desired to be removed, but the other one of the hard mask strips 120 is supposed to be covered by the hard mask layer 140.

For clarity, in the following paragraphs discussing regarding FIGS. 6A to 7B, the hard mask strips exposed by the opening O1 are referred to as the hard mask strips 120A and 120B. From other perspectives, the opening O1 exposes one of the dummy structure 110, the hard mask strip 120A, and the hard mask strip 120B. The opening O1 partially exposes the top surface of the hard mask strip 120B while the opening O1 exposes the whole top surface of the hard mask strip 120A. In other words, at least portion of the top surface of the hard mask strip 120B is covered by the hard mask layer 140. In some embodiments, the exposed surface of the hard mask strip 120A is larger than the exposed surface of the hard mask strip 120B. In some other embodiments, one side of the opening O1 substantially locates on the interface between the hard mask strip 120B and the adjacent dummy structure 130.

Reference is made to FIGS. 7A and 7B, in which FIG. 7A is a perspective view of one stage of manufacturing a semiconductor device, and FIG. 7B is a cross-sectional view taking along line B-B of FIG. 7A. The mask 150 (referring to FIGS. 6A and 6B) is removed. In some embodiments, the mask 150 may be removed by suitable process, such as etching or ashing. The etching process including dry etching process, wet etching process, and/or combination thereof. The etching process may also include a selective wet etch or a selective dry etch. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

After the mask 150 is removed. Another etching process is employed to remove some of the exposed hard mask strips 120 through the openings O1 and O2. In some embodiments, during the etching process, the hard mask strip 120B is partially removed, and a recess R2 is formed in the hard mask strip 120B. On the other hands, during the etching process, a polymer 160 may be formed as being the product of the etching process. In some embodiments, since the exposed surface of the hard mask strip 120B is smaller than the exposed surface of the hard mask strip 120A, part of the polymer 160 may be formed and fills the recess R2 during the etching process. Thus, the remained hard mask strip 120B is covered by the hard mask layer MO and the polymer 160 filled in the recess R2 during the etching process. Since the hard mask strip 120B is supposed to be covered by the hard mask layer 140, the polymer 160 can act as an etching mask during the etching process. On the other hand, due to the larger etching window, other hard mask strips 120 exposed from the openings O1 and O2 (e.g. the hard mask strip 120A in FIGS. 6A and 6B) are removed. In some embodiments, the polymer 160 may be formed on the patterned hard mask layer 140 and the dummy structure 110 adjacent to the recess R2. After the etching process, a recess R3 is formed between two adjacent dummy structures 110 and 130, in which recess R3 is deeper than the recess R2. The recess R3 exposes the etching stop layer 108. In some embodiments, the depth of the recess R2 is smaller than about 20 nm. In some other embodiments, the polymer 160 may also be formed on the sidewalls of the dummy structures 110 and 130 exposed from the openings O1 and O2. For example, a portion of the polymer 160 is formed in the recess R3. It is understood that the shape of the recess R2 and the polymer 160 illustrated in FIGS. 7A and 7B is merely used to explain. In practice, the shape of the recess R2 and the polymer 160 may vary from different etching conditions. In some embodiments, during the etching process, portions of the hard mask layer 140 are removed, such that the thickness of the hard mask layer 140 is reduced.

In some embodiments, the method further includes tuning an amount of the etchants to increase the amount of the polymer 160, such that the polymer 160 may be formed into the recess R2 to protect the hard mask strip 120B. In some other embodiments, tuning the amount of the etchants includes tuning the concentrations of the etchant gases of the etching process.

In some embodiments, the etchants of the etching process include $CF_4$ and $O_2$, and the method includes tuning an amount of $O_2$ to increase the amount of the polymer. For example, the amount of $O_2$ may be decreased, such that the polymer of CF may be increased.

In some other embodiments, the etchants of the etching process include $BCl_3$ and $H_2$, and the method includes tuning an amount of $H_2$ to increase the amount of the polymer. For example, Cl may be consumed by H (dissociated from $H_2$). More $H_2$ consumes more Cl and generates more $BCl_x$ polymer. Thus, by increasing the amount of $H_2$, the amount of the $BCl_x$ polymer may be increased.

In some other embodiments, the etchants of the etching process include $CF_4$ and $CH_4$, and the method includes tuning an amount of $CH_4$ to increase the amount of the polymer. For example, the amount of $CH_4$ may control the polymer thickness of different materials (ex: $Si_3N_4$, $SiO_2$, Si, SiB, SiC . . . etc).

In some other embodiments, the etchants of the etching process include $NF_3$ and $CH_4$, and the method includes tuning an amount of $CH_4$ to increase the amount of the polymer. For example, the amount of $CH_4$ may be increased, such that the polymer of CF may be increased.

Figure 8B:
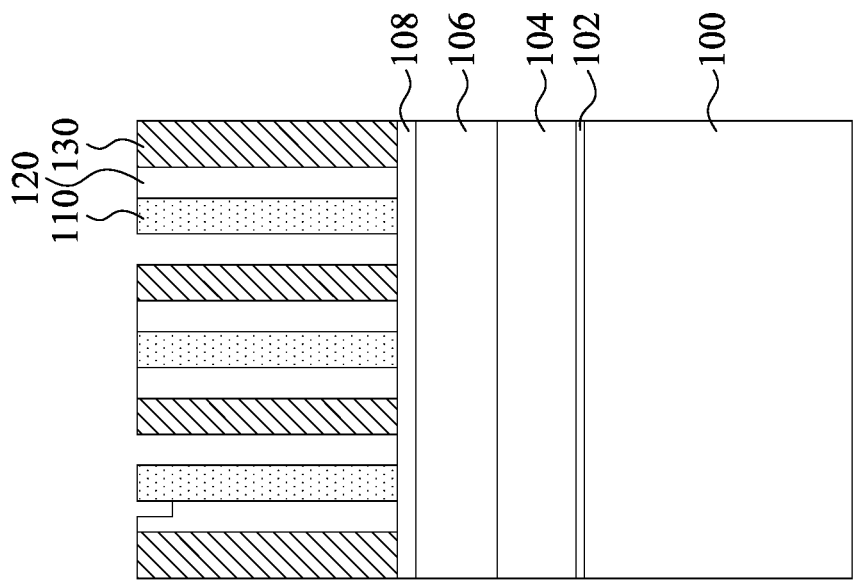
Figure 8A:
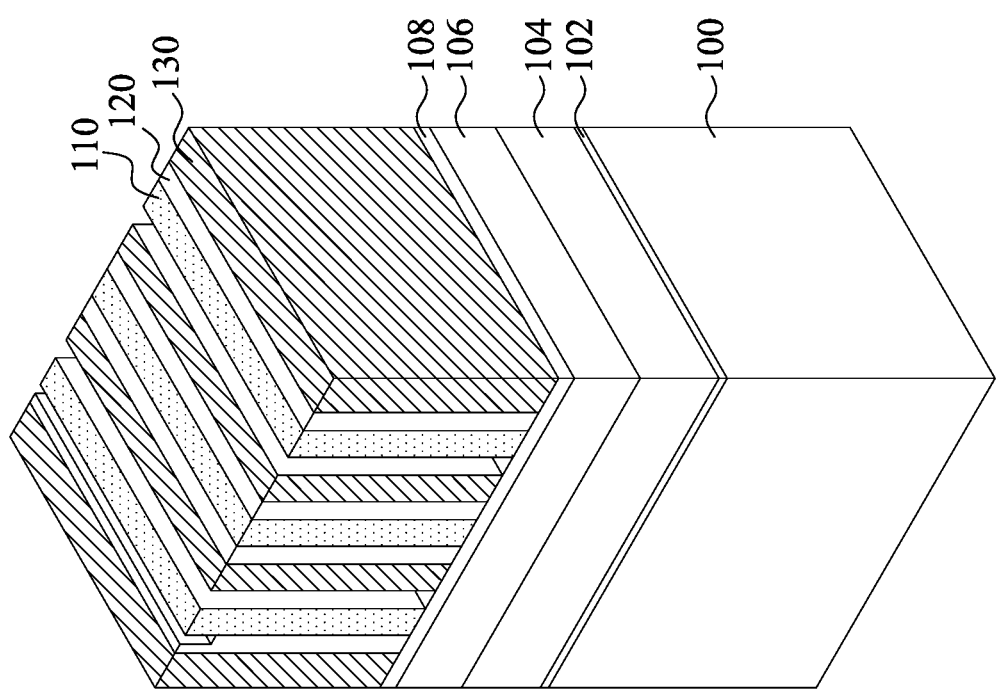

Reference is made to FIGS. 8A and 8B, in which FIG. 8A is a perspective view of one stage of manufacturing a semiconductor device, and FIG. 8B is a cross-sectional view taking along line B-B of FIG. 8A. The hard mask layer 140 and the polymer 160 (referring to FIGS. 7A and 7B) are removed by suitable process, such as one or more etching processes. As a result, a portion of the etching stop layer 108 is exposed. In some embodiments, the polymer 160 may be removed by dry etching or wet etching. In some embodiments, the dry etching may be performed by using a light dry or plasma etching. The hard mask layer 140 may also be removed by dry etching or wet etching.

After the hard mask layer 140 and the polymer 160 are removed, the remained hard mask strips 120, and the dummy structures 110 and 130 are exposed. It is noted that since the hard mask strip 120B is protected by the hard mask layer 140 and the polymer 160 during the etching process shown in FIGS. 7A and 7B, the hard mask strip 120B remains substantially the same profile as the other remained hard mask strips 120.

Figure 9B:
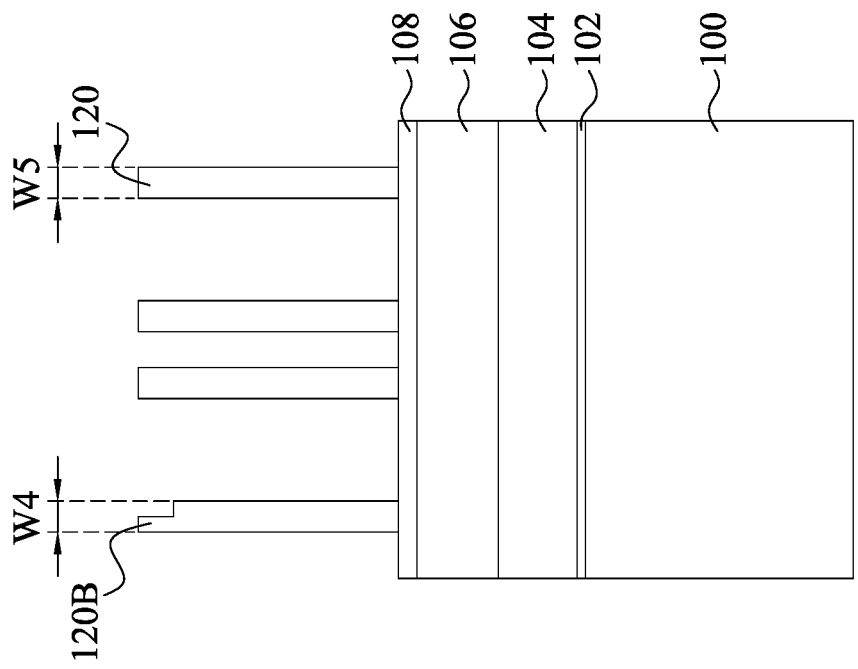
Figure 9A:
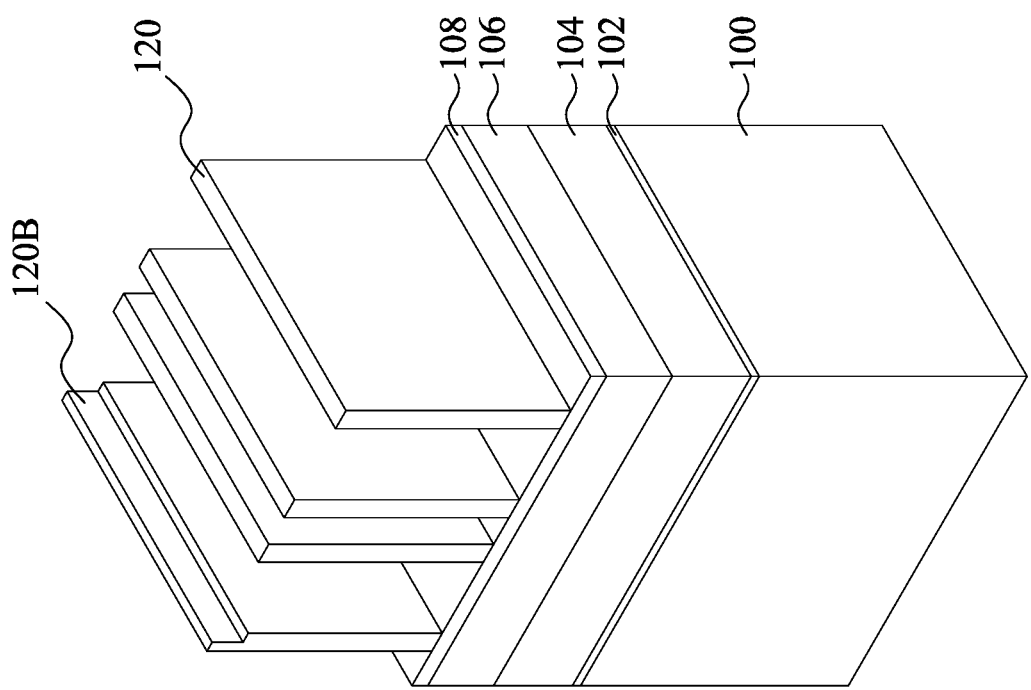

Reference is made to FIGS. 9A and 9B, in which FIG. 9A is a perspective view of one stage of manufacturing a semiconductor device, and FIG. 9B is a cross-sectional view taking along line B-B of FIG. 9A. The dummy structures 110 and the dummy structures 130 (referring to FIGS. 8A and 8B) are removed. In some embodiments, the dummy structures 110 and the dummy structures 130 may be removed by suitable process, such as etching. As a result, the hard mask strips 120 remained on the etching stop layer 108. It is understood that the etching stop layer 108 protects the underlying layer, such as the semiconductor substrate 100, the pad layer 102, the hard mask layer 104, and the hard mask layer 106. In some embodiments, though the hard mask strip 120B is partially removed in the previous process, the lower portion of the hard mask strip 120B has a width W4 that is substantially equal to the width W5 of other hard mask strips 120.

Figure 10B:
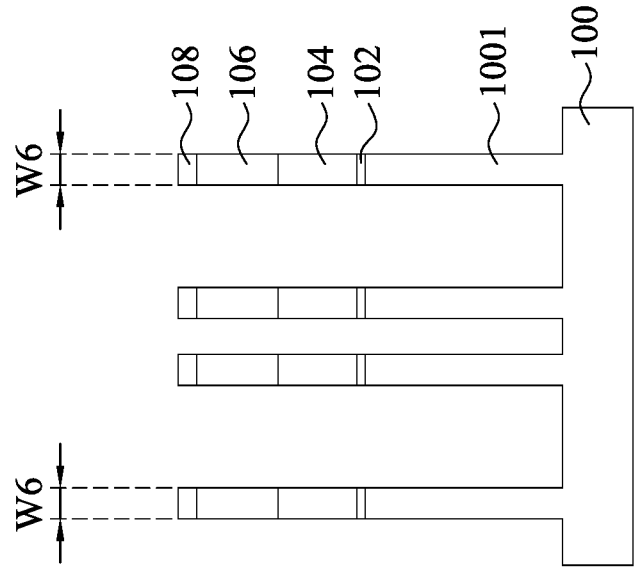
Figure 10A:
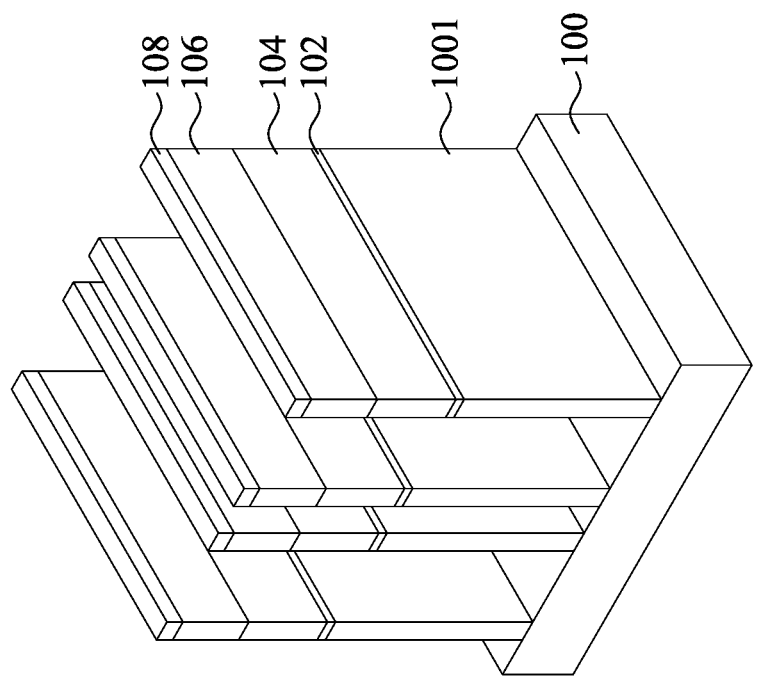

Reference is made to FIGS. 10A and 10B, in which FIG. 10A is a perspective view of one stage of manufacturing a semiconductor device, and FIG. 10B is a cross-sectional taking view along line B-B of FIG. 10A. The etching stop layer 108, the hard mask layer 106, the hard mask layer 140, the pad layer 102, and the semiconductor substrate 100 are patterned using the hard mask strips 120 (referring to FIGS. 9A and 9B) as patterning masks. The patterning process may include multiple etching processes, such as multiple dry etching processes. For example, dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

As a result, a plurality of semiconductor fins 1001 is formed over the semiconductor substrate 100. In some embodiments, the semiconductor fins 1001 have substantially the same width W6.

After the semiconductor fins 1001 are formed, the patterned etching stop layer 108, the patterned hard mask layer 106, the patterned hard mask layer 140, the patterned pad layer 102 are removed, and several structures, such as gate structure (not shown) and source/drain structures (not shown), may be formed over the semiconductor substrate 100 to form a semiconductor device. In some embodiments, the gate structure may include a gate dielectric, a gate electrode over the gate electrode, and plural gate spacers formed on opposite sides of the gate dielectric and the gate electrode.

In some embodiments, the gate electrode may include polycrystalline-silicon (poly-Si) or poly-crystalline silicon-germanium (poly-SiGe). In some other embodiments, the gate electrode may include may include a metal, metal alloy, and/or metal silicide. In some embodiments, the source/drain structures may be epitaxy structures. The source/drain structures may be formed using one or more epitaxy or epitaxial (epi) processes. In some embodiments, the source/drain structure may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

According to the aforementioned embodiments, a plurality of hard mask strips are formed over a substrate. Then, a mask layer having at least one opening is formed over the hard mask strips. The opening may expose one of the hard mask strips and partially expose another one of the hard mask strips adjacent to the one of the hard mask strips. Then, an etching process is performed to remove the one of the hard mask strips. During the etching process, a recess is formed in the another one of the hard mask strips having smaller exposed surface. Further, a polymer is then formed filling the recess to protect the another one of the hard mask strips. As such, the another one of the hard mask strips is avoid to be removed. Further, the method also includes tuning the amount of the etchants of the etching process to increase the forming rate of the polymer. As a result, the another one of the hard mask strips may remain substantially the same profile as the other remained hard mask strips, preventing the corresponding formed semiconductor fin from bending.

In some embodiments of the present disclosure, a method includes forming a mandrel structure over a semiconductor substrate. A first spacer and a second spacer are formed alongside the mandrel structure. A mask layer is over a first portion of the first spacer, in which a second portion of the first spacer and the second spacer are exposed from the mask layer. The exposed second spacer is etched, in which etching the exposed second spacer is performed such that a polymer is formed over a top surface of the exposed second portion of the first spacer. The mask layer, the polymer, and the mandrel structure are removed. The semiconductor substrate is patterned using the first spacer.

In some embodiments of the present disclosure, a method includes forming a first mandrel structure over a semiconductor substrate. A first spacer and a second spacer are formed alongside the mandrel structure. A mask layer is over a first portion of the first spacer, in which a second portion of the first spacer and the second spacer are exposed from the mask layer. The exposed second spacer is etched, in which etching the exposed second spacer is performed such that a polymer is formed over a sidewall of the mandrel structure facing the first spacer. The mask layer, the polymer, and the mandrel structure are removed. The semiconductor substrate is patterned using the first spacer.

In some embodiments of the present disclosure, a method includes forming a mandrel structure over a semiconductor substrate. A first spacer and a second spacer are formed alongside the mandrel structure. A mask layer is over a first portion of the first spacer, in which a second portion of the first spacer and the second spacer are exposed from the mask layer. The exposed second spacer is etched, in which etching the exposed second spacer is performed such that a polymer is formed over a sidewall of the mask layer adjacent to the second portion of the first spacer. The mask layer, the polymer, and the mandrel structure are removed. The semiconductor substrate is patterned using the first spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a mandrel structure over a semiconductor substrate;
    forming a first spacer and a second spacer alongside the mandrel structure;
    forming a mask layer over a first portion of the first spacer, wherein a second portion of the first spacer and the second spacer are exposed from the mask layer;
    etching the exposed second spacer, wherein etching the exposed second spacer is performed such that a polymer is formed over a top surface of the second portion of the first spacer, and such that a recess is formed in the second portion of the first spacer;
    removing the mask layer, the polymer, and the mandrel structure; and
    patterning the semiconductor substrate using the first spacer.

2. The method of claim 1, wherein etching the exposed second spacer is performed such that the polymer is formed on a sidewall of the mandrel structure facing the first spacer.

3. The method of claim 1, wherein etching the exposed second spacer is performed such that the polymer is formed on a sidewall of the mask layer adjacent to the second portion of the first spacer.

4. The method of claim 1, wherein etching the exposed second spacer is performed prior to removing the mandrel structure.

5. The method of claim 1, wherein etching the exposed second spacer is performed such that the recess is filled with the polymer.

6. The method of claim 1, wherein etching the exposed second spacer is performed such that the polymer is formed on a sidewall of the mandrel structure facing away from the first spacer.

7. The method of claim 1, wherein etching the exposed second spacer is performed such that the polymer is formed over a top surface of the mandrel structure.

8. A method, comprising:
    forming a first mandrel structure over a semiconductor substrate;
    forming a first spacer and a second spacer alongside the first mandrel structure;
    forming a mask layer over a first portion of the first spacer, wherein a second portion of the first spacer and the second spacer are exposed from the mask layer;
    etching the exposed second spacer and the second portion of the first spacer to lower a top surface of the second portion of the first spacer and to expose a sidewall of the first portion of the first spacer, wherein etching the exposed second spacer and the second portion of the first spacer is performed such that a polymer is formed on a top surface of the second portion of the first spacer and on the exposed sidewall of the first portion of the first spacer;
    removing the mask layer, the polymer, and the first mandrel structure; and
    patterning the semiconductor substrate using the first spacer.

9. The method of claim 8, wherein etching the exposed second spacer is performed such that the polymer is formed on a sidewall of the first mandrel structure facing the first spacer.

10. The method of claim 8, wherein etching the exposed second spacer is performed such that the polymer is formed over a top surface of the mask layer.

11. The method of claim 8, further comprising:
    forming a second mandrel structure alongside the second spacer.

12. The method of claim 11, further comprising:
    etching the exposed second spacer is performed such that the polymer is formed on a sidewall of the second mandrel structure facing the first mandrel structure.

13. The method of claim 8, wherein etching the exposed second spacer is performed using carbon tetrafluoride ($CF_4$) and oxygen.

14. The method of claim 8, wherein etching the exposed second spacer is performed using boron trichloride ($BCl_3$) and hydrogen.

15. A method, comprising:
    forming a mandrel structure over a semiconductor substrate;
    forming a first spacer and a second spacer alongside the mandrel structure;

forming a mask layer over a first portion of the first spacer, wherein a second portion of the first spacer and the second spacer are exposed from the mask layer;

etching the exposed second spacer, wherein etching the exposed second spacer is performed such that a polymer is formed on a top surface of the second portion of the first spacer and between the first portion of the first spacer and the mandrel structure;

removing the mask layer, the polymer, and the mandrel structure; and patterning the semiconductor substrate using the first spacer.

16. The method of claim 15, wherein etching the exposed second spacer is performed such that the polymer is formed on opposite sidewalls of the mandrel structure.

17. The method of claim 15, further comprising:
forming an etching stop layer over the semiconductor substrate prior to forming the mandrel structure.

18. The method of claim 15, wherein etching the exposed second spacer is performed using carbon tetrafluoride ($CF_4$) and methane ($CH_4$).

19. The method of claim 15, wherein etching the exposed second spacer is performed using nitrogen trifluoride ($NF_3$) and methane ($CH_4$).

20. The method of claim 15, wherein etching the exposed second spacer is performed such that the second portion of the first spacer is recessed.

\* \* \* \* \*